(12) United States Patent
Ishida et al.

(10) Patent No.: US 7,255,467 B2
(45) Date of Patent: Aug. 14, 2007

(54) VEHICULAR HEADLAMP AND LIGHT EMISSION MODULE

(75) Inventors: Hiroyuki Ishida, Shizuoka-ken (JP); Masashi Tatsukawa, Shizuoka-ken (JP)

(73) Assignee: Koito Manufacturing Co., Ltd., Minato-Ku (JP)

( * ) Notice: Subject to any disclaimer, the term of this patent is extended or adjusted under 35 U.S.C. 154(b) by 86 days.

(21) Appl. No.: 10/769,056

(22) Filed: Jan. 30, 2004

(65) Prior Publication Data

US 2004/0184280 A1  Sep. 23, 2004

(30) Foreign Application Priority Data

Feb. 6, 2003  (JP) .............................. 2003-029485

(51) Int. Cl.
*F21V 5/04* (2006.01)
*F21V 21/00* (2006.01)

(52) U.S. Cl. ...................... 362/520; 362/521; 362/522; 362/539; 362/545

(58) Field of Classification Search ................ 362/800, 362/507, 538–540, 543–545, 296, 326, 335–340, 362/520, 475, 307–310, 509, 511, 522, 514, 362/516, 521, 240, 237, 244, 328, 327

See application file for complete search history.

(56) References Cited

U.S. PATENT DOCUMENTS

| 4,562,519 | A | * | 12/1985 | Deves | 362/308 |
| 5,081,564 | A | * | 1/1992 | Mizoguchi et al. | 362/521 |
| 5,136,483 | A | * | 8/1992 | Schoniger et al. | 362/545 |
| 5,199,779 | A | * | 4/1993 | Sato | 362/538 |
| 5,394,310 | A | * | 2/1995 | Iwasaki | 362/538 |
| 5,459,646 | A | * | 10/1995 | Sato | 362/460 |
| 5,526,239 | A | * | 6/1996 | Sato | 362/461 |
| 5,570,951 | A | * | 11/1996 | Bertling et al. | 362/231 |
| 5,803,576 | A | * | 9/1998 | Gallo | 362/507 |
| 6,328,456 | B1 | * | 12/2001 | Mize | 362/311 |
| 6,406,172 | B1 | * | 6/2002 | Harbers et al. | 362/544 |
| 6,945,672 | B2 | * | 9/2005 | Du et al. | 362/241 |
| 6,951,416 | B2 | * | 10/2005 | Sazuka et al. | 362/538 |
| 2003/0202359 | A1 | * | 10/2003 | Albou | 362/514 |
| 2004/0174712 | A1 | * | 9/2004 | Yagi | 362/475 |

FOREIGN PATENT DOCUMENTS

| JP | 11-154766 | 6/1999 |
| JP | 2002-094129 | 3/2002 |

OTHER PUBLICATIONS

Patent Abstracts of Japan, Publication No. 11-154766 dated Jun. 8, 1999, 1 pg.
Patent Abstracts of Japan, Publication No. 2002-094129 dated Mar. 29, 2002, 1 pg.

* cited by examiner

*Primary Examiner*—Sandra O'Shea
*Assistant Examiner*—Bao Q. Truong
(74) *Attorney, Agent, or Firm*—Osha Liang LLP

(57) ABSTRACT

A vehicular headlamp for emitting light ahead of an automobile, includes: a semiconductor light emitting device; a reflector, having its optical center on the semiconductor light emitting device, for reflecting light generated by the semiconductor light emitting device forward; and a light transmitting member formed from material that transmits the light generated by the semiconductor light emitting device in such a manner that the light transmitting member covers the semiconductor light emitting device, the light transmitting member deflecting forward a part of the light generated by the semiconductor light emitting device and transmitting another part of the light generated by the semiconductor light emitting device toward the reflector.

15 Claims, 12 Drawing Sheets

VEHICULAR HEADLAMP AND LIGHT EMISSION MODULE

This patent application claims priority from a Japanese patent application No. 2003-029485 filed on Feb. 6, 2003, the contents of which are incorporated herein by reference.

BACKGROUND OF THE INVENTION

1. Field of the Invention

The present invention relates to a vehicular headlamp and a light emission module. More particularly, the present invention relates to a vehicular headlamp for emitting light ahead of an automobile.

2. Description of the Related Art

A light emitting diode module has been conventionally known that improves efficiency in the use of light by using a reflecting mirror as disclosed, for example, in Japanese Patent Application Publication (Laid-Open) No. 2002-94129. In this light emitting diode module, light emitted by a light emitting device is reflected by a concave mirror provided on a back face of mold resin.

The vehicular headlamp including, for example, regular headlamp, fog lamp and cornering lamp for automobiles, trains, motorcycles or the like, should form light distribution pattern with high precision from safety reasons. Therefore, it is necessary to control the light emitted by the light emitting device with high precision. However, when sufficient consideration of the light distribution pattern to be formed was not made, the efficient use of the light became difficult in some cases.

SUMMARY OF THE INVENTION

Therefore, it is an object of the present invention to provide a vehicular headlamp and a light emission module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp for emitting light ahead of an automobile, comprises: a semiconductor light emitting device; a reflector, having its optical center on the semiconductor light emitting device, operable to reflect light generated by the semiconductor light emitting device forward; and a light transmitting member formed from material that transmits the light emitted by the semiconductor light emitting device in such a manner that the light transmitting member covers the semiconductor light emitting device, the light transmitting member deflecting forward a part of the light generated by the semiconductor light emitting device and transmitting another part of the light generated by the semiconductor light emitting device toward the reflector.

The reflector may be formed to cover the light transmitting member from a back of the semiconductor light emitting device, and the light transmitting member may comprise: a rear sealing part having a shape like a quarter sphere having its center around the semiconductor light emitting device, the rear sealing part sealing the semiconductor light emitting device from behind; and a front sealing part having a shape in which a radius of curvature of a surface in a cross section parallel to a direction of light emission by the vehicular headlamp is smaller than a radius of curvature of a surface of the quarter sphere, the front sealing part being formed integrally with the rear sealing part to seal the semiconductor light emitting device from the front of the semiconductor light emitting device.

The vehicular headlamp may further comprise a lens operable to direct the light generated by the semiconductor light emitting device ahead of the automobile, wherein the reflector makes the reflected light incident on the lens, and the light transmitting member deflects forward a part of the light generated by the semiconductor light emitting device to make the part of the light incident on the lens.

The vehicular headlamp may further comprise a light blocking member, provided between the semiconductor light emitting member and the lens, operable to block a part of the light generated by the semiconductor light emitting device, wherein the reflector converges the reflected light in the vicinity of an edge of the light blocking member, the lens forms at least a part of a cut line for defining a boundary between a bright region and a dark region in a light distribution pattern of the vehicular headlamp based on a shape of the edge of the light blocking member, and the light transmitting member deflects forward a part of the light generated by the semiconductor light emitting device to make the part of the light pass in the vicinity of the edge of the light blocking member.

The reflector may reflect the light generated by the semiconductor light emitting device toward a substantially horizontal direction, and the light transmitting member nay deflect a part of light generated in a forward direction by the semiconductor light emitting device, toward the substantially horizontal direction.

According to the second aspect of the present invention, a light emission module for generating light used in a vehicular headlamp, comprises: a semiconductor light emitting device; and a light transmitting member, formed from material transmitting light generated by the semiconductor light emitting device, operable to deflect a part of the light generated by the semiconductor light emitting device toward a direction corresponding to a forward direction f an automobile and to transmit another part of the light straight.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

For example, the vehicular headlamp to which the present invention is applied may include, but not limited thereto, regular headlamp, fog lamp and cornering lamp for automobiles, trains, motorcycles or the like.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
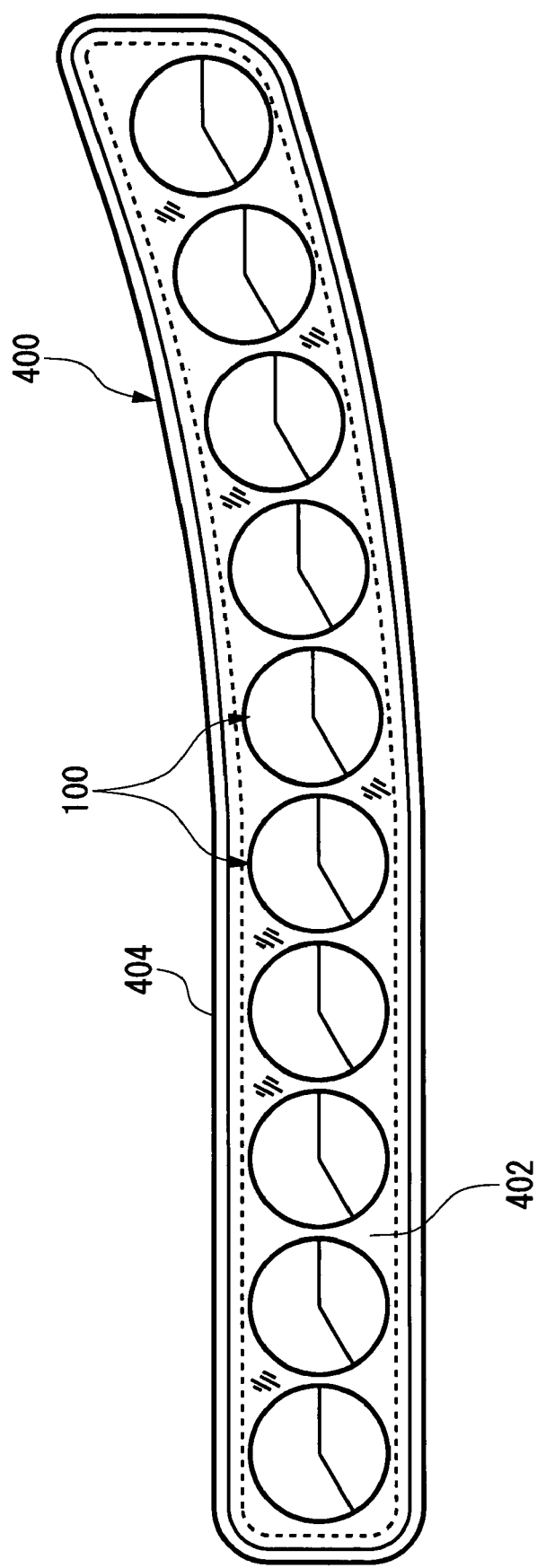
FIG. 1 illustrates an exemplary structure of a vehicular headlamp according an embodiment of the present invention.

FIG. 1 illustrates an exemplary structure of a vehicular headlamp 400 according to an embodiment of the present invention. The vehicular headlamp 400 of this example aims to use light generated by a light source with high efficiency. The vehicular headlamp 400 is a vehicular headlamp for emitting a low beam and accommodates a plurality of light source units 100 arranged in a substantially horizontal line within a lamp chamber formed by a transparent cover 402 and a lamp body 404.

The light source units 100 have the same or similar structure and are accommodated in the lamp chamber in such a manner that their optical axes are at a downward angle of about 0.3 to about 0.6 degrees with respect to a longitudinal direction of an automobile when the vehicular headlamp 400 is mounted on the body of the automobile.

The vehicular headlamp 400 emits light ahead of the automobile based on the light emitted by those light source units 100, so as to form a predetermined light distribution pattern. The vehicular headlamp 400 may include a plurality of light source units 100 each having different light distribution characteristics. Alternatively, the vehicular head lamp 400 may include a single light source unit 100 to form a light distribution pattern based on the light emitted by this single light source unit 100.

Figure 2:
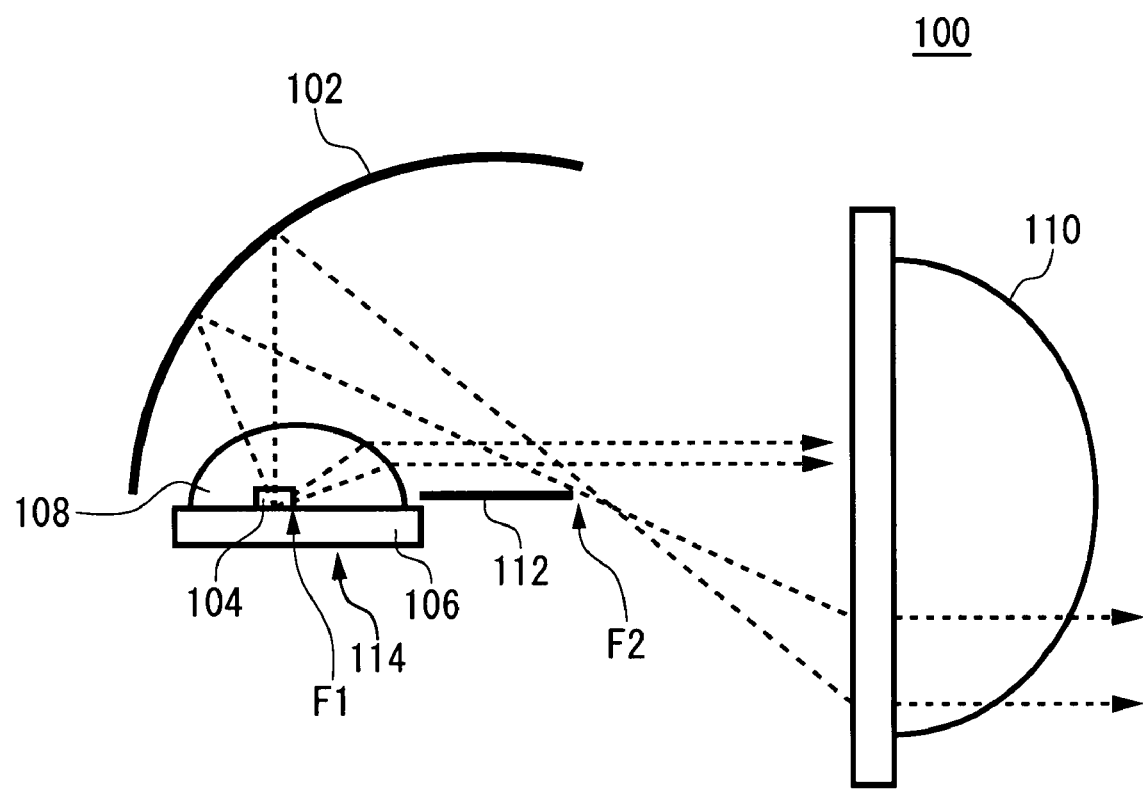
FIG. 2 illustrates an exemplary structure of a light source unit.

FIG. 2 illustrates an exemplary structure of the light source unit 100. The light source unit 100 of this example is a projector-type light source unit that emits light that was reflected and converged at a position near the optical axis, forward via a lens. The light source unit 100 includes a light source 114, a reflector 102, a light blocking member 112 and a lens 110.

The light source 114 is an example of a light emission module that generates light used in the vehicular headlamp 400 (see FIG. 1). In this example, the light source 114 is a light emitting diode module that generates white light and includes a semiconductor light emitting device 104, a substrate 106 and a light transmitting member 108.

In this example, the semiconductor light emitting device 104 is a light emitting diode device (LED) that generates blue light, and makes the blue light incident on phosphors (not shown) provided between the semiconductor light emitting device 104 and the light transmitting member 108, thereby causing the phosphors to generate yellow light that is light of complementary color of blue. In this manner, the semiconductor light emitting device 104 generates white light.

In an alternative example, the semiconductor light emitting device 104 may cause the phosphors to generate white light by irradiating the phosphors with ultraviolet light. In this manner, the semiconductor light emitting device 104 can generate white light, too.

The substrate 106 is a plate-like component which fixes the semiconductor light emitting device 104 placed on its upper face. The light transmitting member 108 is a mold formed from material that can transmit white light generated by the semiconductor light emitting device 104 so as to cover the semiconductor light emitting device 104. The light transmitting member 108 is formed to seal the semiconductor light emitting device 104 from above in such a manner that the light transmitting member 108 is opposed to the substrate 106 with the semiconductor light emitting device 104 sandwiched therebetween.

In this example, the light transmitting member 108 has a shape in which a part to be positioned close to the front of the automobile is flatter than a part to be positioned close to the rear part of the automobile. Due to such a shape, the light transmitting member 108 can deflect forward substantially all of light generated upward in the forward direction by the semiconductor light emitting device 104, thereby making that light incident on the lens 110. In this case, the light transmitting member 108 may deflect at least a part of the light emitted in the forward direction by the semiconductor light emitting device 104, in a direction toward the front of the automobile, i.e., a substantially horizontal direction.

The light transmitting member 108 transmits substantially all of light generated upward in the backward direction by the semiconductor light emitting device 104 toward the reflector 102 by, for example, transmitting that light straight. Thus, the light transmitting member 108 can make at least most of the light generated by the semiconductor light emitting device 104 incident on the lens 110 or reflector 102 at an appropriate incident angle.

The reflector 102 is a combined elliptical reflecting mirror provided to extend over the light source 114 from behind toward a position above and anterior to the light source 114, and is formed to approximately surround the light source from behind, from above and from the sides of the light source 114. In this manner, the reflector 102 reflects forward approximately all of light emitted by the semiconductor light emitting device 104 toward the reflector 102, thereby making the reflected light incident on the lens 110. The reflector 102 may be formed to cover the light transmitting member 108 from the back of the semiconductor light emitting device 104.

At least a part of the reflector 102 has focal points F1 and F2 of an elliptical surface in a horizontal plane substantially containing the semiconductor light emitting device 104. In this example, this part of the reflector 102 has the focal point F1 on the semiconductor light emitting device 104 and the focal point F2 in the vicinity of the front edge of the light blocking member 112. Therefore, the reflector 102 converges the reflected light at a position in the vicinity of the front edge of the light blocking member 112. Please note that the focal points F1 and F2 are an example of an optical center that is a focal point, a reference point in optical design or the like. Moreover, in accordance with precision required for forming a cut line, that part of the reflector 102 may have the focal point F1 in a predetermined region on the semiconductor light emitting device 104 that corresponds to the required precision.

The light blocking member 112 is a plate-like component provided between the semiconductor light emitting device 104 and the lens 110 in the horizontal plane substantially containing the semiconductor light emitting device 104, and blocks a part of light generated by the semiconductor light emitting device 104 at the front edge thereof. In this example, the upper face of the light blocking member 112 is formed by a reflecting mirror. In this case, the light blocking member 112 blocks the light incident thereon by reflecting it. The light blocking member 112 may allow the reflected light to be incident on the lens 110. Thus, it is possible to use the light generated by the semiconductor light emitting device 104 with high efficiency.

The lens 110 is a lens made of resin such as polyether sulfone (PES), and forms at least apart of the light distribution pattern of the vehicular headlamp 400 by directing the light generated by the semiconductor light emitting device 104 ahead of the automobile. In this example, the lens 110 has its focal point in the vicinity of the front edge of the light blocking member 112 and directs the light substantially converged in the vicinity of the front edge of the light blocking member 112 by the reflector 102, ahead of the automobile as substantially collimated light. In this manner, the lens 110 forms at least a part of a cut line that defines a boundary between a bright region and a dark region in the light distribution pattern based on the shape of the front edge of the light blocking member 112.

Here, a case is considered where a part of the light generated by the semiconductor light emitting device 104 passes between the reflector 102 and the lens 110. In this case, this light is not incident on either the reflector 102 or the lens 110. Therefore, this light makes no contribution to the light distribution by the light source unit 100. Thus, the light is not used efficiently.

However, according to this example, at least most of the light generated by the semiconductor light emitting device 104 is incident on the reflector 102 or lens 110 at an appropriate incident angle. Therefore, it is possible to use the light generated by the semiconductor light emitting device 104 with high efficiency.

Moreover, if the direction of the light generated by the semiconductor light emitting device 104 were controlled by using mold, for example, sufficient precision could not be obtained when the direction of the light that passed through the mold was not appropriate. Therefore, that light could not be used for forming the light distribution pattern of the vehicular headlamp. However, in this example, the light transmitting member 108, the light blocking member 112, and the lens 110 are formed appropriately with respect to the position of the semiconductor light emitting device 104 in order to form the light distribution pattern. Therefore, according to this example, it is possible to appropriately use the light generated by the semiconductor light emitting device 104 with high efficiency so as to form an appropriate light distribution pattern.

Figure 3:
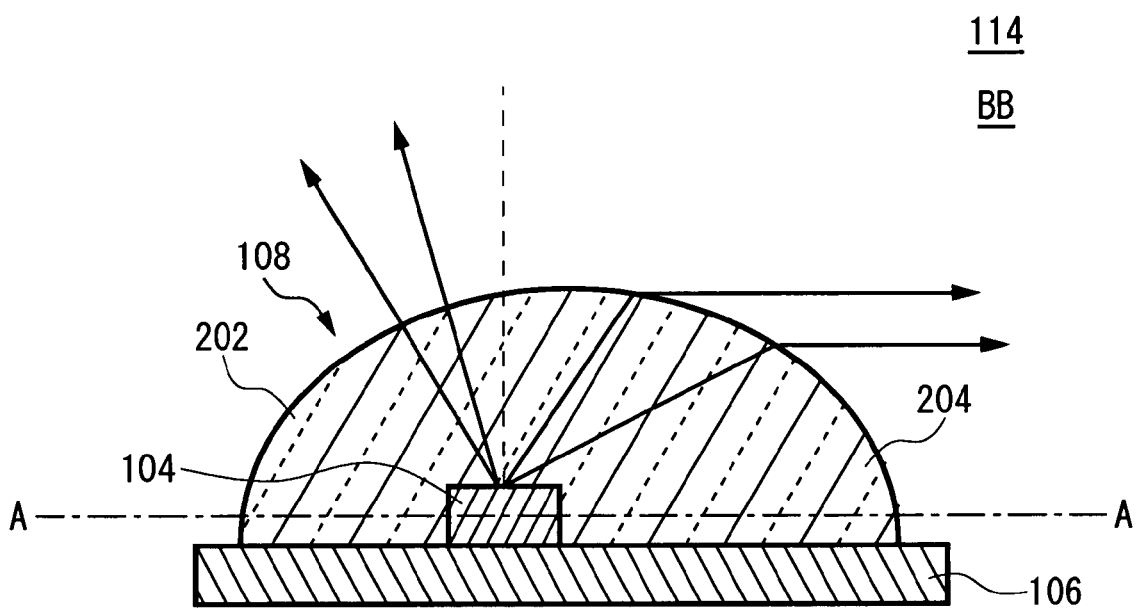
FIG. 3 shows a BB vertical cross section of a light source.
Figure 4:
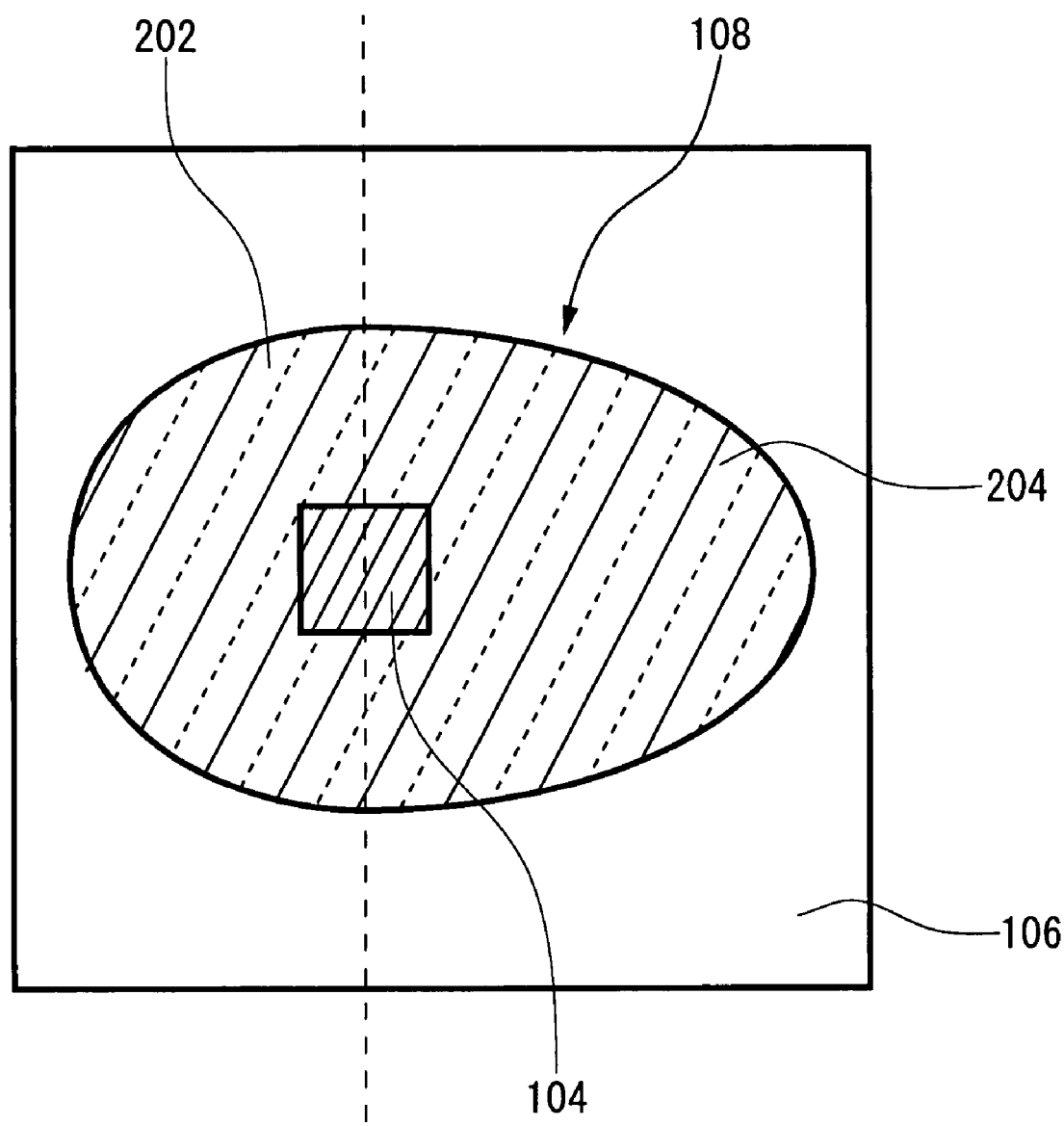
FIG. 4 shows an AA horizontal cross section of the light source.

FIGS. 3 and 4 show details of the structure of the light source 114. FIG. 3 shows a BB vertical cross section of the light source 114, while FIG. 4 shows an AA horizontal cross section thereof.

In this example, the light transmitting member 108 includes a rear sealing part 202 and a front sealing part 204 that correspond to two parts of the light transmitting member 108, respectively. The rear sealing part 202 has a shape like a quarter sphere having a focal point thereof in proximity of the semiconductor light emitting device 104, and seals a rear side of the semiconductor light emitting device 104. Thus, the rear sealing part 202 transmits the light generated by the semiconductor light emitting device 104 upward in the rearward direction, substantially straight.

The front sealing part 204 has a more flattened shape than the rear sealing part 202. The front sealing part 204 is formed integrally with the rear sealing part 202, thereby sealing a front side of the semiconductor light emitting device 104. Thus, the front sealing part 204 deflects further forward the light generated upward in the frontward direction by the semiconductor light emitting device 104. The front sealing part 204 has a shape in which a radius of curvature of a surface in the cross section parallel to the direction in which the vehicular headlamp 400 (see FIG. 1) emits light is smaller than that of the surface of the rear sealing part 202, for example. According to this example, it is possible to use the light generated by the semiconductor light emitting device 104 with high efficiency in the light source unit 100 (see FIG. 2).

Figure 5:
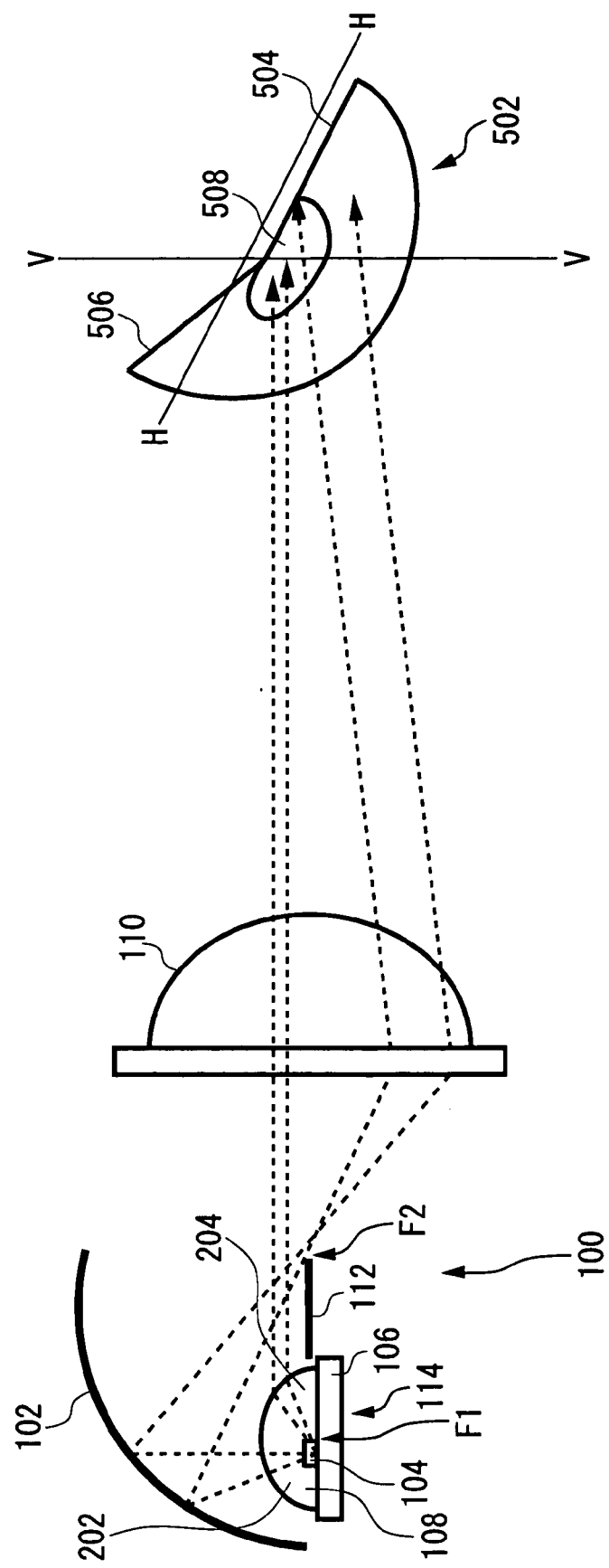
FIG. 5 is a conceptual diagram of an exemplary light distribution pattern.

FIG. 5 is a conceptual diagram showing an exemplary light distribution pattern 502 formed by the light source unit 100. The light distribution pattern 502 is a low-beam light distribution pattern formed on a virtual vertical screen arranged at a position 25 meters ahead of the light source unit 100.

The reflector 102 forms a boundary between a bright region and a dark region based on the shape of the front edge of the light blocking member 112 by focusing the light at the focal point F2 in the vicinity of the front edge of the light blocking member 112. The lens 110 then casts forward the light focused in the vicinity of the front edge of the light blocking member 112, so as to form a horizontal cut line 504 and a diagonal cut line 506 that define a boundary between bright and dark regions in the light distribution pattern 502 based on the boundary between the bright and dark regions formed in the vicinity of the front edge of the light blocking member 112.

The front edge of the light blocking member 112 may have a shape in which both ends are turned down seen from the front, for example to correspond to the horizontal cut line 504 and the diagonal cut line 506. Moreover, the lens 110 may direct the light reflected to a position away from the focal point F2 by the reflector 102, toward a region other than the horizontal cut line 504 and the diagonal cut line 506 in the light distribution pattern 502 as diffused light, for example.

In this example, the light transmitting member 108 deflects forward a part of the light generated by the semiconductor light emitting device 104, thereby making the part of the light pass in the vicinity of the position of the focus of the lens 110 so as to make the part of the light incident directly on the lens 110. In this case, the lens 110 directs this incident light to a region 508 directly below an intersection of the horizontal cut line 504 and the diagonal cut line 506, the region 508 being in the center region of the light distribution pattern 502. Thus, the light source unit 100 clearly forms the horizontal cut line 504 and the diagonal cut line 506 in the center region (hot zone) of the light distribution pattern 502. Therefore, according to this example, it is possible to efficiently use the light generated by the semiconductor light emitting device 104 so as to form an appropriate light distribution pattern 502.

Figure 6:
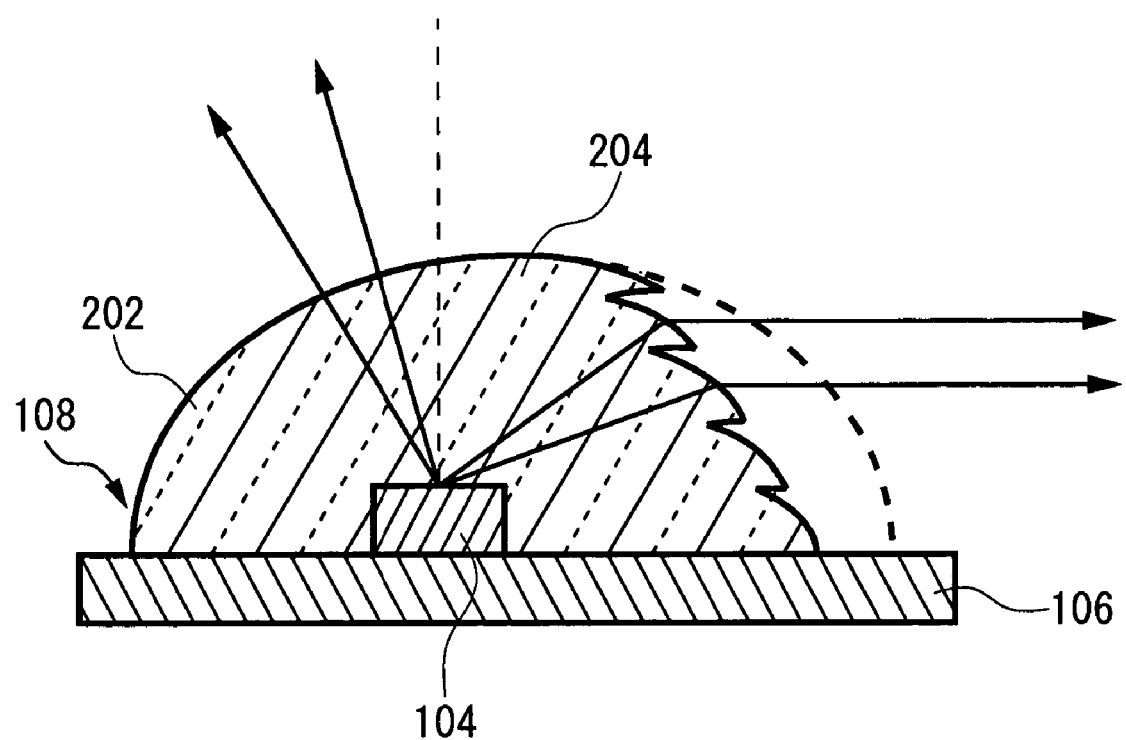
FIG. 6 shows a vertical cross section of another exemplary light source.

FIG. 6 is a vertical cross-sectional view of another exemplary light source 114. In this example, the front face of the front sealing part 204 is formed like a Fresnel lens. In this case, the size of the front sealing part 204 can be reduced as compared with that of the front sealing part 204 that was described referring to FIG. 3 and is shown with broken line in FIG. 6. Moreover, in this case, the size of the light source 114 can be reduced. Except for the above, the components shown in FIG. 6 having the same reference numerals as those in FIG. 3 have the same or similar functions as/to those of the components shown in FIG. 3 and therefore the description thereof is omitted.

Figure 7:
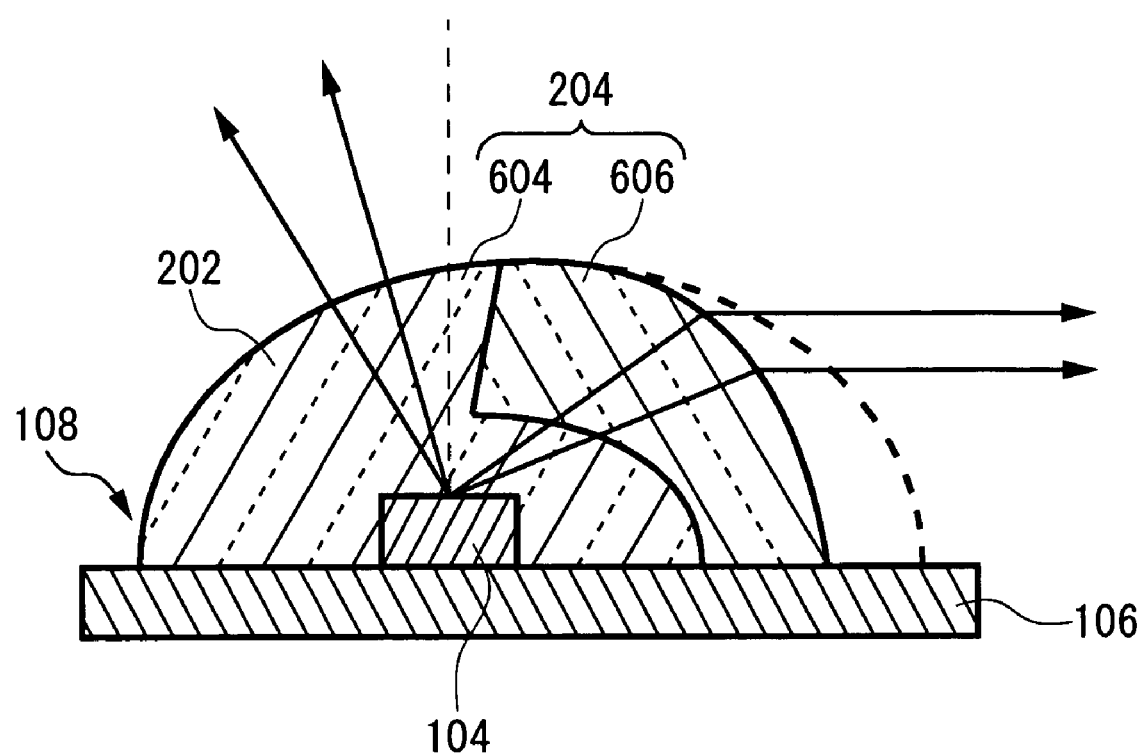
FIG. 7 shows a vertical cross section of still another exemplary light source.

FIG. 7 shows a vertical cross section of still another exemplary light source 114. In this example, the front sealing part 204 includes the first member 604 and the second member 606. The first member 604 is formed integrally with the rear sealing part 202 from the same material as that of the rear sealing part 202 and seals the semiconductor light emitting device 104 from the front of the semiconductor light emitting device 104. The second member 606 is formed from material having higher refractive index than that of the first member 604 so as to cover the first member 604 from the front side of the first member 604. Thus, the second member 606 deflects forward light that is incident from the semiconductor light emitting device 104 via the first member 604.

In this example, a part of the front sealing part 204 is formed from material having higher refractive index than that of the rear sealing part 202. In this case, the surface of the front sealing part 204 can be formed to have a larger radius of curvature than that of the front sealing part 204 described referring to FIG. 3. Therefore, also in this example, the size of the front sealing part 204 can be reduced.

Except for the above, the components shown in FIG. 7 having the same reference numerals as those in FIG. 3 have the same or similar functions as/to those of the components in FIG. 3 and therefore the description thereof is omitted. In still another example, the front sealing part 204 may be entirely formed from material having higher refractive index than that of the rear sealing part 202.

Figure 8:
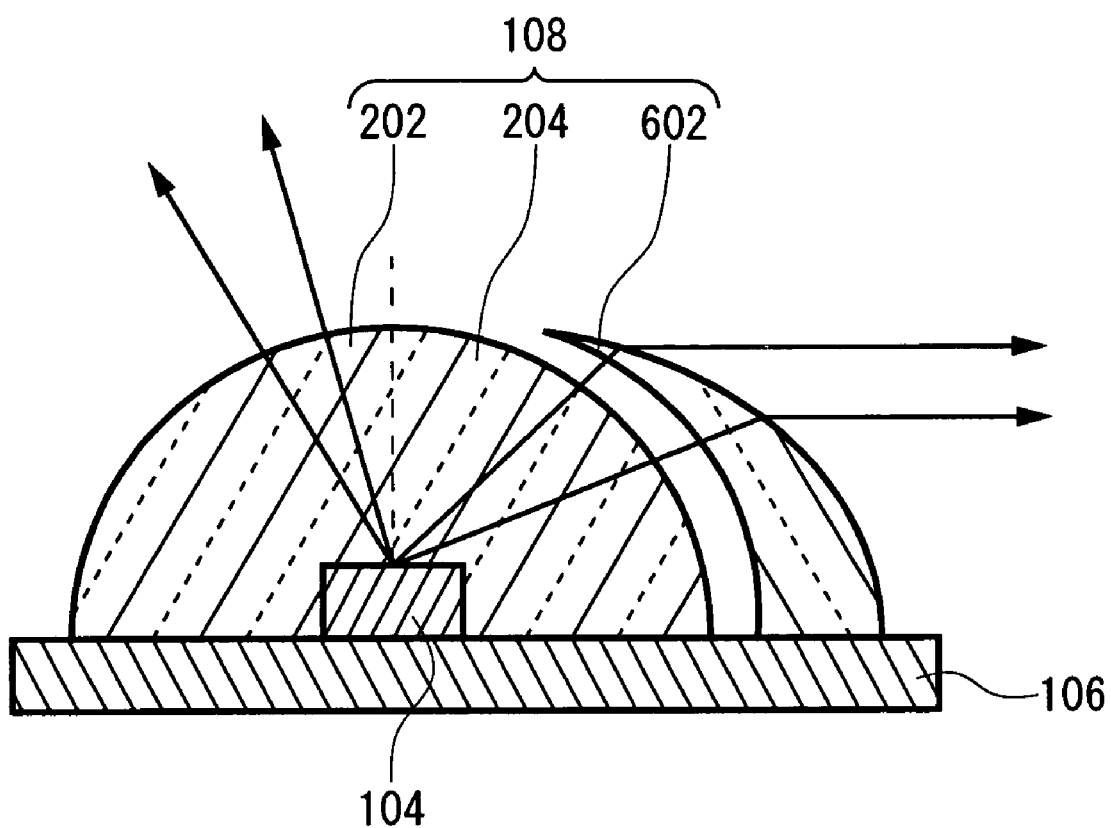
FIG. 8 shows a vertical cross section of still another exemplary light source.

FIG. 8 shows a vertical cross section of still another exemplary light source 114. In this example, the light transmitting member 108 further includes a deflection member 602. Moreover, the rear sealing part 202 and the front sealing part 204 are formed integrally with each other to have an approximately hemispherical shape. In this case, the front sealing part 204 may have an approximately quarter-spherical shape.

The deflection member 602 is formed from material that can transmit light generated by the semiconductor light emitting device 104, that is the same material as the front sealing part 204, for example, so as to cover the front of the front sealing part 204. Moreover, the radius of curvature of the front face of the deflection member 602 is smaller than that of the front face of the front sealing part 204. Thus, the deflection member 602 deflects forward light incident via the front sealing part 204 from the semiconductor light emitting device 104. Also in this case, it is possible to use the light generated by the semiconductor light emitting device 104 with high efficiency in the light source unit (see FIG. 2). Moreover, according to this example, the light source 114 can be simply formed by adding the deflection member 602 to a general-purpose light emitting diode module having a hemispherical mold, for example.

The deflection member 602 maybe formed from material having higher refractive index than that of the front sealing part 204. In this case, the size of the deflection member 602 can be reduced. Moreover, the deflection member 602 may be provided to be away from the front sealing part 204 or be in contact at its rear face with the front face of the front sealing part 204. Except for the above, the components shown in FIG. 8 having the same reference numerals as those in FIG. 3 have the same or similar functions as/to those of the components in FIG. 3 and therefore the description thereof is omitted.

Figure 9:
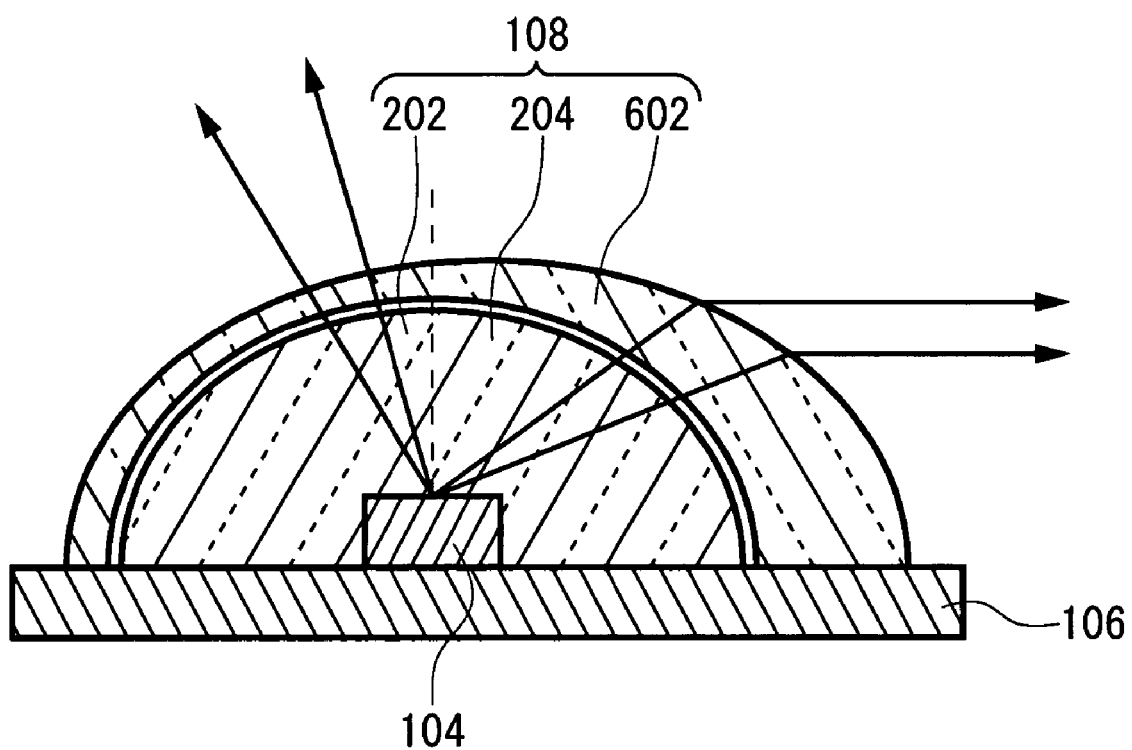
FIG. 9 shows a vertical cross section of still another exemplary light source.

FIG. 9 shows a vertical cross section of still another exemplary light source 114. In this example, the deflection member 602 is formed to cover the upper faces and the side faces of the rear and front sealing parts 202 and 204. A part of the deflection member 602 to be positioned close to the rear of the automobile may have a shape like a spherical shell having a substantially constant thickness. A part of the deflection member 602 to be positioned close to the front of the automobile may have a shape in which the thickness gradually increases toward the front.

Due to the above structure, the deflection member 602 allows light incident from the semiconductor light emitting device 104 via the rear sealing part 202 to pass therethrough straight. Moreover, the deflection member 602 deflects forward light incident from the semiconductor light emitting device 104 via the front sealing part 204. According to this example, it is also possible to simply form the light source 114. Except for the above, the components shown in FIG. 9 having the same reference numerals in FIG. 8 have the same or similar functions as/to those of the components in FIG. 8 and therefore the description thereof is omitted.

Figure 10:
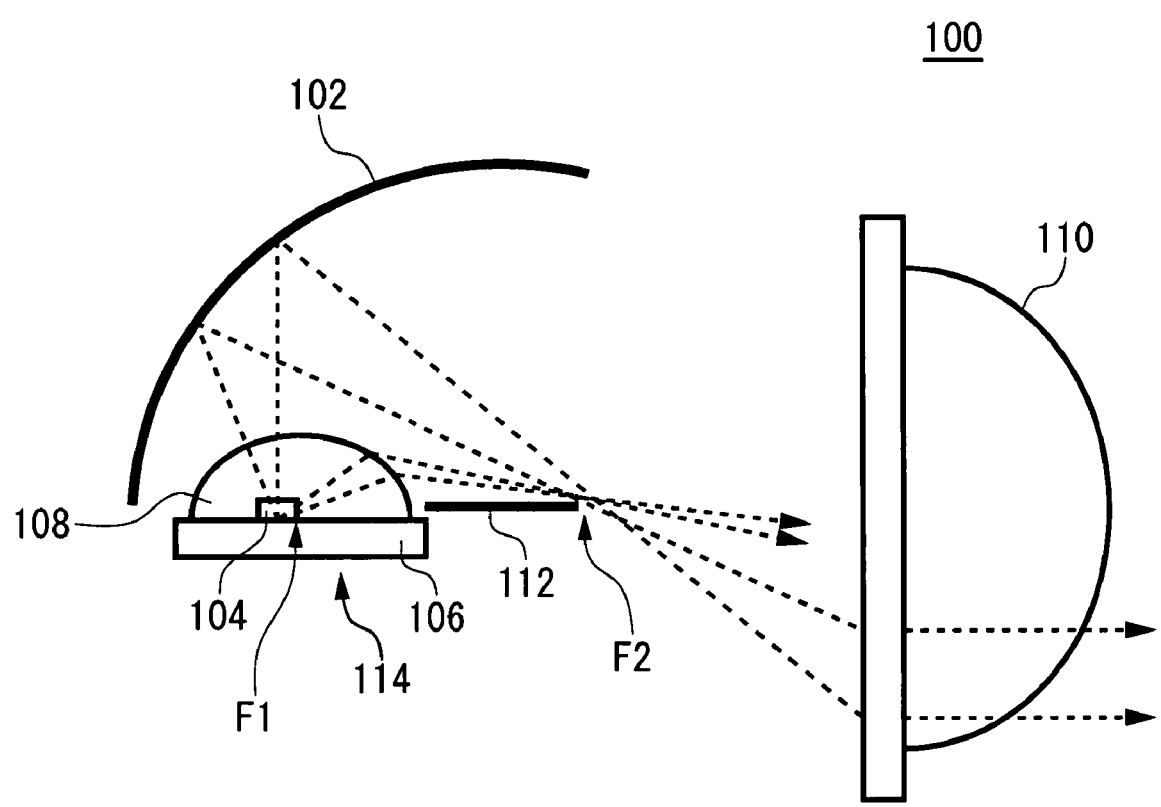
FIG. 10 illustrates another exemplary structure of the light source unit.

FIG. 10 shows another exemplary structure of the light source unit 100. In this example, the light transmitting member 108 deflects light generated upward in the forward direction by the light source 114, downward in the forward direction. The light transmitting member 108 preferably makes the deflected light pass in the vicinity of the front edge of the light blocking member 112. In this case, the light transmitting member 108 makes this light incident on a position further closer to the cut line of the light distribution pattern.

Thus, according to this example, it is possible to form the light distribution pattern more appropriately. Except for the above, the components shown in FIG. 10 having the same reference numerals in FIG. 2 have the same or similar functions as/to those in FIG. 2 and the description thereof is omitted.

Figure 11:
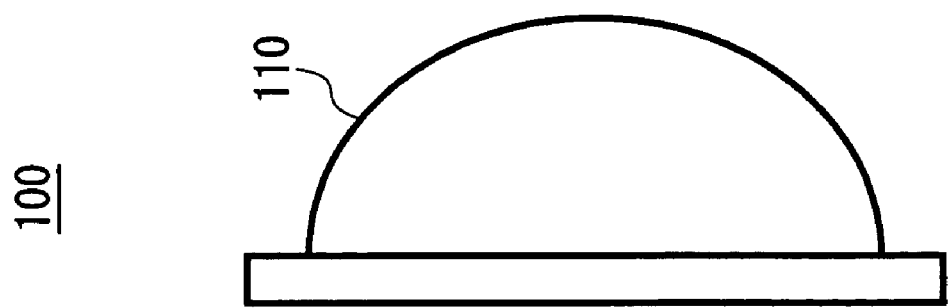
FIG. 11 illustrates still another exemplary structure of the light source unit.
Figure 11:
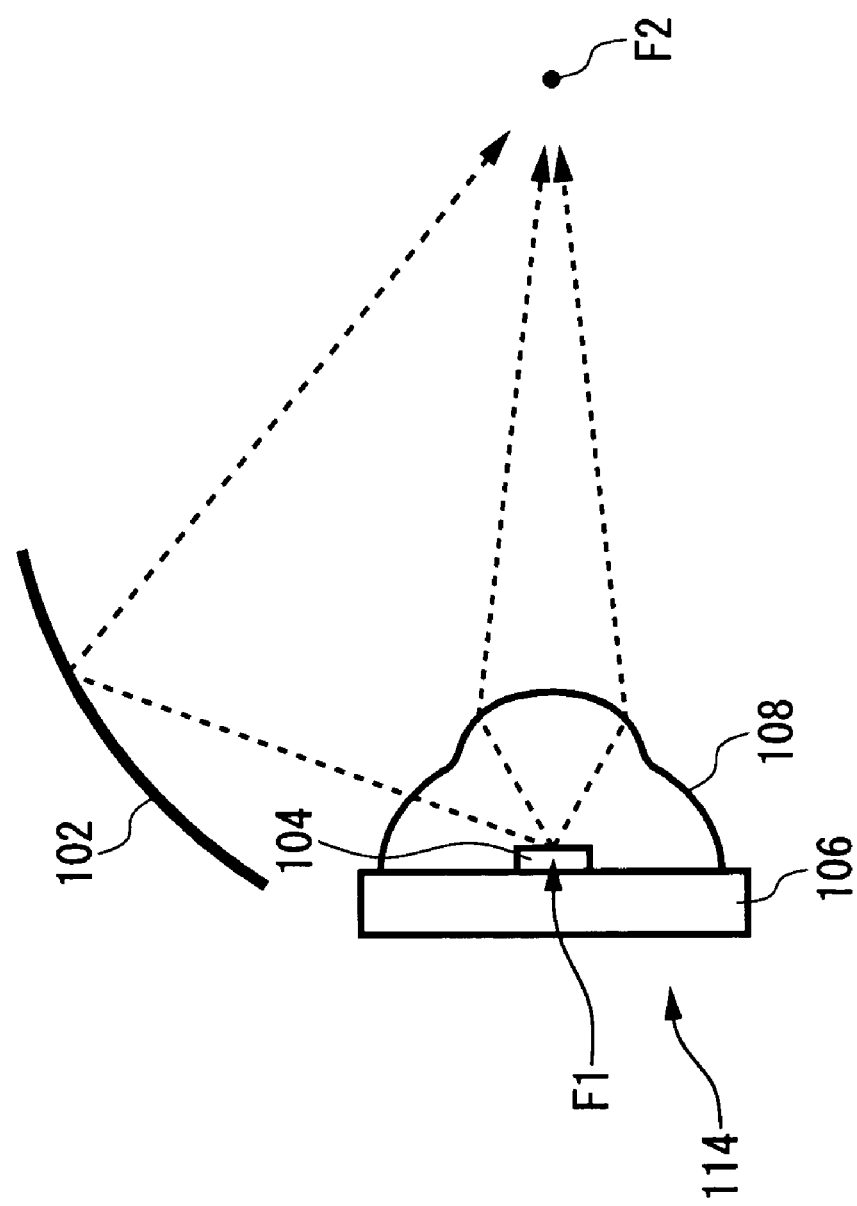

FIG. 11 shows still another example of the light source unit 100. In this example, the light source 114 is provided to face toward the front of the automobile. The light transmitting member 108 has a shape in which a region around an apex of a substantial hemisphere having its center around the semiconductor light emitting device 104 protrudes toward the front of the automobile.

The above protruding region of the light transmitting member 108 deflects forward a part of light generated by the semiconductor light emitting device 104, which is at an angle within a predetermined region with respect to the optical axis of the light source unit 100, so as to converge the part of the light in the vicinity of a predetermined focal point F2, and then makes that part of the light incident on the lens 110. Moreover, a hemispherical region of the light transmitting member 108 other than that protruding region makes the light generated by the semiconductor light emitting device 104 pass straight. At least a part of this hemispherical region makes the light passing therethrough incident on the reflector 102.

In this example, the reflector 102 is formed to cover the light source 114 from above. In an alternative example, the reflector 102 may be formed to further cover the light source 114 from the side and/or beneath. The reflector 102 converges the reflected light in the vicinity of the focal point F2.

The lens 110 directs the light that was incident thereon after being converged at the focal point F2 forward, thereby forming the light distribution pattern. According to this example, it is possible to control light generated by the semiconductor light emitting device 104 with high precision and use it efficiently. Moreover, the light distribution pattern can be formed appropriately based on the light controlled with high precision.

The light source unit 100 further includes a light blocking member (not shown) for forming the cut line, in the vicinity of the focal point F2. In this case, the lens 110 may form the cut line based on the shape of that edge of that light blocking member. Except for the above, the components shown in FIG. 11 having the same reference numerals in FIG. 2 have the same or similar functions as/to those of the components in FIG. 2 and therefore the description thereof is omitted.

Figure 12:
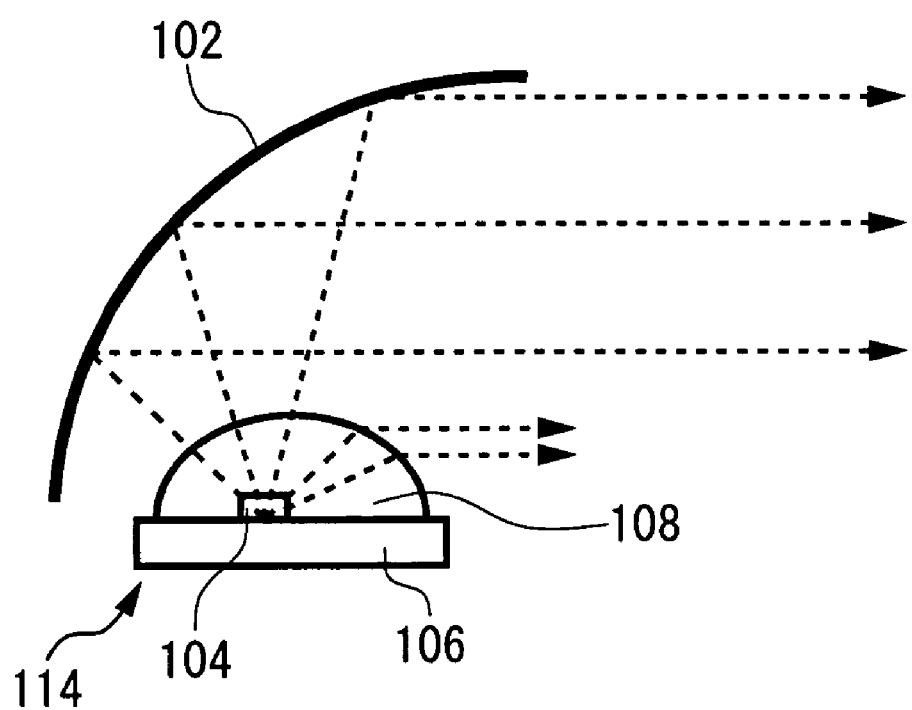
FIG. 12 illustrates still another exemplary structure of the light source unit.

FIG. 12 shows still another example of the structure of the light source unit 100. The light source unit 100 of this example is a parabolic light source unit that emits light forward by using a parabolic reflecting face, and includes the reflector 102 and the light source 114. The light source 114 includes the semiconductor light emitting device 104, the substrate 106 and the light transmitting member 108.

In this example, the light transmitting member 108 deflects substantially all of light generated upward in the forward direction by the semiconductor light emitting device 104, toward the substantially horizontal direction. Moreover, the light transmitting member 108 transmits substantially all of light generated upward in the backward direction by the semiconductor light emitting device 104 to pass therethrough straight, for example, thereby transmitting this light toward the reflector 102.

The reflector 102 is a parabolic reflecting mirror having a focal point near the semiconductor light emitting device 104. The reflector 102 reflects the light generated upward in the backward direction by the semiconductor light emitting device 104, toward the substantially horizontal direction. According to this example, it is possible to make substantially all of the light generated by the semiconductor light emitting device 104 go toward the substantially horizontal direction with high efficiency.

The light source unit 100 may make light deflected by the light transmitting member 108 and light reflected by the reflector 102 incident on a region other than the cut line in the light distribution pattern as diffused light, for example. In this case, it is also possible to use the light generated by the semiconductor light emitting device 104 with high efficiency so as to form the light distribution pattern appropriately. Except for the above, the components shown in FIG. 12 having the same reference numerals in FIG. 2 have the same or similar functions as/to those of the components in FIG. 2 and therefore the description thereof is omitted.

As is apparent from the above, according to the present invention, it is possible to use light generated by the semiconductor light emitting device with high efficiency.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular headlamp, comprising:
a semiconductor light emitting device facing in a direction substantially perpendicular to a forward direction;
a reflector configured in a curved shape having an aperture in a front side to surround said semiconductor light emitting device, wherein said reflector has an optical center thereof in proximity of said semiconductor light emitting device, and reflects light incident from said semiconductor light emitting device toward the front side; and
a light transmitting member configured to cover said semiconductor light emitting device, wherein said light transmitting member comprises a rear sealing part shaped like a quarter sphere and a front sealing part shaped such that a radius of curvature of a surface in a cross section parallel to the forward direction is smaller than a radius of curvature of a surface of the rear sealing part, wherein the front sealing part deflects a portion of light generated by said semiconductor light emitting device toward the front side and the rear sealing part transmits a portion of said light generated by said semiconductor light emitting device toward said reflector.

2. A vehicular headlamp, comprising:
a semiconductor light emitting device facing in a direction substantially perpendicular to a forward direction;
a reflector configured in a curved shape having an aperture in a front side to surround said semiconductor light emitting device, wherein said reflector has an optical center thereof in proximity of said semiconductor light emitting device, and reflects light incident from said semiconductor light emitting device toward the front side; and
a light transmitting member configured to cover said semiconductor light emitting device, wherein said light transmitting member comprises a front sealing part and a rear sealing part, wherein the front sealing part deflects a portion of light generated by said semiconductor light emitting device toward the front side and the rear sealing part transmits a portion of said light generated by said semiconductor light emitting device toward said reflector;
wherein said reflector is formed to cover said light transmitting member from a rear side of said semiconductor light emitting device, and said light transmitting member comprises:
the rear sealing part having a shape like a quarter sphere having a focal point in proximity of said semiconductor light emitting device, wherein said rear sealing part seals a rear side of said semiconductor light emitting device; and
the front sealing part having a shape in which a radius of curvature of a surface in a cross section parallel to the forward direction is smaller than a radius of curvature of a surface of said rear sealing part, wherein said front sealing part is formed integrally with said rear sealing part to seal a front side of said semiconductor light emitting device.

3. The vehicular headlamp as claimed in claim 1, further comprising a lens disposed in the front side, wherein said lens receives said reflected light by the reflector and said deflected light by said light transmitting member.

4. A vehicular headlamp, comprising:
a semiconductor light emitting device facing in a direction substantially perpendicular to a forward direction;
a reflector configured in a curved shape having an aperture in a front side to surround said semiconductor light emitting device, wherein said reflector has an optical center thereof in proximity of said semiconductor light emitting device, and reflects light incident from said semiconductor light emitting device toward the front side;
a light transmitting member configured to cover said semiconductor light emitting device, wherein said light transmitting member comprises a front sealing part and a rear sealing part, wherein the front sealing part deflects a portion of light generated by said semiconductor light emitting device toward the front side and the rear sealing part transmits a portion of said light generated by said semiconductor light emitting device toward said reflector;

a lens disposed in the front side, wherein said lens receives said reflected light by the reflector and said deflected light by said light transmitting member; and a light blocking member, provided between said semiconductor light emitting member and said lens, operable to block a part of said light generated by said semiconductor light emitting device, wherein said reflector converges said reflected light in the vicinity of an edge of said light blocking member, said lens forms at least a part of a cut line for defining a boundary between a bright region and a dark region in a light distribution pattern of said vehicular headlamp based on a shape of said edge of said light blocking member, and said light transmitting member deflects forward a part of said light generated by said semiconductor light emitting device to make said part of said light pass in the vicinity of said edge of said light blocking member.

5. The vehicular headlamp as claimed in claim 1, wherein said reflector reflects said light generated by said semiconductor light emitting device toward a substantially horizontal direction, and said light transmitting member deflects a part of light generated in the forward direction by said semiconductor light emitting device, toward said substantially horizontal direction.

6. The vehicular headlamp as claimed in claim 3, wherein the portion of light, deflected by said light transmitting member toward the front side, pass in a vicinity of a focus of the lens.

7. A vehicular headlamp, comprising:

a semiconductor light emitting device facing in a direction substantially perpendicular to a forward direction;

a reflector configured in a curved shape having an aperture in a front side to surround said semiconductor light emitting device, wherein said reflector has an optical center thereof in proximity of said semiconductor light emitting device, and reflects light incident from said semiconductor light emitting device toward the front side; and a light transmitting member configured to cover said semiconductor light emitting device, wherein said light transmitting member comprises a rear sealing part shaped like a quarter sphere and a front sealing part shaped such that a radius of curvature of a surface in a cross section parallel to the forward direction is smaller than a radius of curvature of a surface of the rear sealing part, the front sealing part deflects a portion of light generated by said semiconductor light emitting device toward the front side and the rear sealing part transmits a portion of said light generated by said semiconductor light emitting device toward said reflector, said light transmitting member comprises a deflection member covering the front side of the front sealing part, and a radius of curvature of a front face of the deflection member is smaller than the radium of curvature of a front face of the front sealing part.

8. The vehicular headlamp as claimed in claim 7, further comprising a lens disposed in the front side, wherein said lens receives said reflected light by the reflector and said deflected light by said light transmitting member.

9. The Vehicular headlamp as claimed in claim 7, further comprising a light blocking member, provided between said semiconductor light emitting member and said lens, operable to block a part of said light generated by said semiconductor light emitting device, wherein said reflector converges said reflected light in the vicinity of an edge of said light blocking member, said lens forms at least a part of a cut line for defining a boundary between a bright region and a dark region in a light distribution pattern of said vehicular headlamp based on a shape of said edge of said light blocking member, and said light transmitting member deflects forward a part of said light generated by said semiconductor light emitting device to make said part of said light pass in the vicinity of said edge of said light blocking member.

10. The vehicular headlamp as claimed in claim 7, wherein said reflector reflects said light generated by said semiconductor light emitting device toward a substantially horizontal direction, and said light transmitting member deflects a part of light generated in the forward direction by said semiconductor light emitting device, toward said substantially horizontal direction.

11. The vehicular headlamp as claimed in claim 8, wherein the portion of light, deflected by said light transmitting member toward the front side, pass in a vicinity of a focus of the lens.

12. The vehicular headlamp as claimed in claim 2, further comprising a lens disposed in the front side, wherein said lens receives said reflected light by the reflector and said deflected light by said light transmitting member.

13. The Vehicular headlamp as claimed in claim 2, further comprising a light blocking member, provided between said semiconductor light emitting member and said lens, operable to block a part of said light generated by said semiconductor light emitting device, wherein said reflector converges said reflected light in the vicinity of an edge of said light blocking member, said lens forms at least a part of a cut line for defining a boundary between a bright region and a dark region in a light distribution pattern of said vehicular headlamp based on a shape of said edge of said light blocking member, and said light transmitting member deflects forward a part of said light generated by said semiconductor light emitting device to make said part of said light pass in the vicinity of said edge of said light blocking member.

14. The vehicular headlamp as claimed in claim 2, wherein said reflector reflects said light generated by said semiconductor light emitting device toward a substantially horizontal direction, and said light transmitting member deflects a part of light generated in the forward direction by said semiconductor light emitting device, toward said substantially horizontal direction.

15. The vehicular headlamp as claimed in claim 12, wherein the portion of light, deflected by said light transmitting member toward the front side, pass in a vicinity of a focus of the lens.

* * * * *